United States Patent
Kim et al.

(10) Patent No.: US 6,833,585 B2
(45) Date of Patent: Dec. 21, 2004

(54) HIGH VOLTAGE LATERAL DMOS TRANSISTOR HAVING LOW ON-RESISTANCE AND HIGH BREAKDOWN VOLTAGE

(75) Inventors: Min-hwan Kim, Kyungki-do (KR); Chang-ki Jeon, Kimpo (KR); Young-suk Choi, Kyungki-do (KR)

(73) Assignee: Fairchild Korea Semiconductor, Bucheon (KR)

( * ) Notice: Subject to any disclaimer, the term of this patent is extended or adjusted under 35 U.S.C. 154(b) by 0 days.

(21) Appl. No.: 10/120,207

(22) Filed: Apr. 10, 2002

(65) Prior Publication Data

US 2003/0193067 A1 Oct. 16, 2003

(30) Foreign Application Priority Data

Apr. 16, 2001 (KR) ........................................ 2001-20168

(51) Int. Cl.$^7$ .......................... H01L 29/76; H01L 29/94; H01L 31/062; H01L 31/113; H01L 31/119
(52) U.S. Cl. ...................... 257/343; 257/335; 257/336; 257/337; 257/338; 257/339; 257/340; 257/341; 257/342
(58) Field of Search .................................. 257/335–343

(56) References Cited

U.S. PATENT DOCUMENTS

| | | | | |
|---|---|---|---|---|
| 4,040,016 A | * | 8/1977 | Lee et al. ................... 365/183 |
| 4,831,423 A | | 5/1989 | Shannon |
| 5,602,417 A | * | 2/1997 | Villa .......................... 257/593 |
| 5,604,359 A | * | 2/1997 | Naruse et al. ................ 257/69 |
| 5,894,145 A | * | 4/1999 | Chen et al. .................. 257/296 |
| 5,925,905 A | * | 7/1999 | Hanneberg et al. ......... 257/299 |
| 5,976,922 A | * | 11/1999 | Tung .......................... 438/228 |
| 6,072,215 A | * | 6/2000 | Kawaji et al. ............... 257/334 |
| 6,087,232 A | | 7/2000 | Kim et al. |
| 6,097,063 A | * | 8/2000 | Fujihira ...................... 257/339 |
| 6,107,142 A | * | 8/2000 | Suvorov et al. ............. 438/285 |
| 6,140,170 A | * | 10/2000 | Shibib ......................... 438/203 |
| 6,232,827 B1 | * | 5/2001 | De et al. ..................... 327/537 |
| 6,462,378 B1 | * | 10/2002 | Kim ............................ 257/342 |
| 6,468,847 B1 | * | 10/2002 | Disney ........................ 438/197 |
| 6,664,590 B2 | * | 12/2003 | Deboy ......................... 257/328 |
| 6,677,643 B2 | * | 1/2004 | Iwamoto et al. ............ 257/341 |
| 2002/0063259 A1 | * | 5/2002 | Usui et al. ................... 257/110 |
| 2002/0167020 A1 | * | 11/2002 | Iwamoto et al. ............ 257/110 |
| 2003/0132450 A1 | * | 7/2003 | Minato et al. ............... 257/110 |

FOREIGN PATENT DOCUMENTS

KR        2000-8375      2/2000

\* cited by examiner

*Primary Examiner*—Amir Zarabian
*Assistant Examiner*—Ida M. Soward
(74) *Attorney, Agent, or Firm*—Thomas R. FitzGerald, Esq.; Laurence S. Roach, Esq.

(57) ABSTRACT

A high voltage lateral Double diffused Metal Oxide Semiconductor (DMOS) transistor includes a plurality of well regions of a first conductivity type formed to be spaced out within a well region of a second conductivity type between a channel region of the first conductivity type and a drain region of the second conductivity type. Most current is carried through some portions of the well region of the second conductivity type in which the well regions of the first conductivity do not appear so that the current carrying performance of the device is improved. When a bias voltage is applied to the drain region, the well region of the second conductivity type is completely depleted at other portions where the well region of the second conductivity type and the well regions of the first conductivity type alternately appear so that the breakdown voltage of the device can be increased. In addition, since the well region of the second conductivity type can be easily depleted, not only the breakdown voltage can be increased, but also the impurity concentration of the well region of the second conductivity type can be increased. Accordingly, the on-resistance of the device can be decreased.

13 Claims, 5 Drawing Sheets

HIGH VOLTAGE LATERAL DMOS TRANSISTOR HAVING LOW ON-RESISTANCE AND HIGH BREAKDOWN VOLTAGE

REFERENCE TO RELATED APPLICATIONS

This application claims priority of Korean patent application Serial No. 01-20168, filed Apr. 16, 2001.

BACKGROUND OF THE INVENTION

1. Field of the Invention

The present invention relates to a power semiconductor device, and more particularly, to a high voltage lateral Double diffused Metal Oxide Semiconductor (DMOS) transistor having low on-resistance and high breakdown voltage.

2. Description of the Related Art

Integrated circuits in which a control function and a driver function are combined are usually referred to as smart power devices. Such a smart power device has a lateral DMOS transistor at its output terminal which is designed to usually operate with high voltage. In such a high voltage lateral DMOS transistor, breakdown voltage is critical in terms of the stability of a device, and on-resistance is critical in terms of the operational characteristics of the device. In order to decrease the on-resistance of the device, the doping concentration within a drift region between a drain region and a channel region should be increased. However, in this case, the drift region is not completely depleted resulting in a decrease in breakdown voltage. To overcome this problem, recently, lateral DMOS transistors employing a double Reduced Surface Field (RESURF) structure have been developed. A lateral DMOS transistor employing the double RESURF structure is disclosed in U.S. Pat. No. 6,087,232.

FIG. 1 is a layout diagram of an example of a conventional high voltage lateral DMOS transistor employing the double RESURF structure. FIG. 2 is a cross-section of the high voltage lateral DMOS transistor of FIG. 1, taken along the line II—II.

Referring to FIGS. 1 and 2, a p⁻ well region 11 and an n-well region 12 are formed in the upper portion of a p-type semiconductor substrate 10. A p-body region 13 having a channel region on its surface and a deep p⁺ region 14 surrounded by the p-body region 13 are formed in the upper portion of the p⁻ well region 11. An n⁺ source region 15 and a p⁺ contact region 16 surrounded by the n-source region 15 are formed in the upper portion of the p-body region 13 including its surface. The channel region is formed in the upper portion of the p-body region 13, that is, between the n⁺ source region 15 and the n-well region 12. A p-top region 17 and an n⁺ drain region 18 are formed in the upper portion of the n-well region 12 at a predetermined distance from each other.

A gate insulation layer 19 and a gate electrode 20 are sequentially formed on the channel region of the p-body region 13. The n⁺ source region 15 and the p⁺ contact region 16 are electrically connected to a source electrode 21. The n⁺ drain region 18 is electrically connected to a drain electrode 22. The gate electrode 20, the source electrode 21 and the drain electrode 22 are insulated from one another by an interlayer insulation layer 23. Reference numeral 24 denotes an isolation layer.

In such a lateral DMOS transistor, when a bias voltage is applied to the n⁺ drain region 18, a reverse bias voltage is applied to a first junction $J_1$ between the semiconductor substrate 10 and the n-well region 12, and to a second junction $J_2$ between the p-top region 17 and the n-well region 12. Here, a depletion region is vertically formed around the first and second junctions $J_1$ and $J_2$. Particularly, since a depletion region in the n-well region 12 is formed out of not only the first junction $J_1$ but also the second junction $J_2$, the n-well region 12 is completely depleted. When the n-well region 12 is completely depleted, a surface electric field is uniformly formed between the n⁺ source region 15 and the n⁺ drain region 18 so that the breakdown voltage of the device increases.

However, the on-resistance of the device may increase due to the p-top region 17. In addition, an area, in which carriers move, between the n~ source region 15 and the n⁺ drain region 18 is reduced so that the current carrying performance of the device is reduced.

SUMMARY OF THE INVENTION

To solve the above problems, it is an object of the present invention to provide a high voltage lateral Double diffused Metal Oxide Semiconductor (DMOS) transistor having low on-resistance and high breakdown voltage without reducing current carrying performance between a source and a drain.

Accordingly, to achieve the above object of the invention, there is provided a high voltage lateral DMOS transistor including a semiconductor substrate of a first conductivity type. A gate electrode is partially formed on the semiconductor substrate to be insulated from the semiconductor substrate. A body region of the first conductivity type with a channel region overlapping with the gate electrode is formed in a first area of the semiconductor substrate. A source region of a second conductivity type is formed within the body region. A drift region of the second conductivity type is formed in a second area of the semiconductor substrate adjacent to the channel region. A drain region of the second conductivity type is formed within the drift region. Pluralities of well regions of the first conductivity type are formed to be horizontally spaced out within the drift region.

Preferably, each of the well regions of the first conductivity type has the shape of a column, the top surfaces of the well regions and the top surface of the drift region are on the same plane, and the bottom surfaces of the well regions and the bottom surface of the drift region are on the same plane. Preferably, each of the top and bottom surfaces of each well region of the first conductivity type having the shape of a column has a circular shape. Preferably, the well regions of the first conductivity type are disposed between the channel region and the drain region. Preferably, the high voltage lateral DMOS transistor further includes a source electrode electrically connected to the source region, and a drain electrode electrically connected to the drain region. Preferably, the first conductivity type is a p-type, and the second conductivity type is an n-type. Alternatively, the first conductivity type may be an n-type, and the second conductivity type may be a p-type.

BRIEF DESCRIPTION OF THE DRAWINGS

The above objective and advantages of the present invention will become more apparent by describing in detail a preferred embodiment thereof with reference to the attached drawings in which.

DETAILED DESCRIPTION OF THE PRESENT INVENTION

Figure 1:
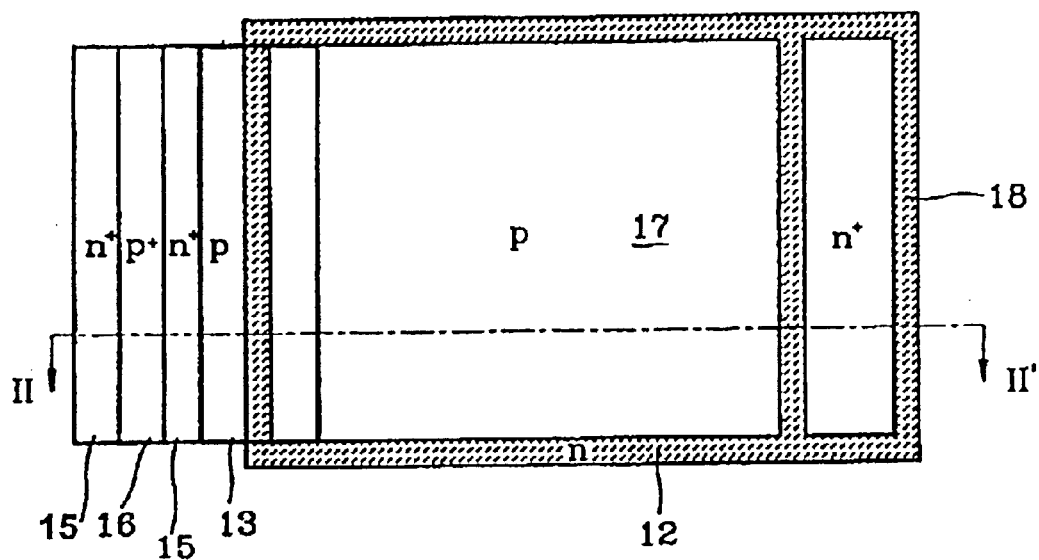
FIG. 1 is a layout diagram of an example of a conventional high voltage lateral Double diffused Metal Oxide Semiconductor (DMOS) transistor employing a double Reduced Surface Field (RESURF) structure.
Figure 2:
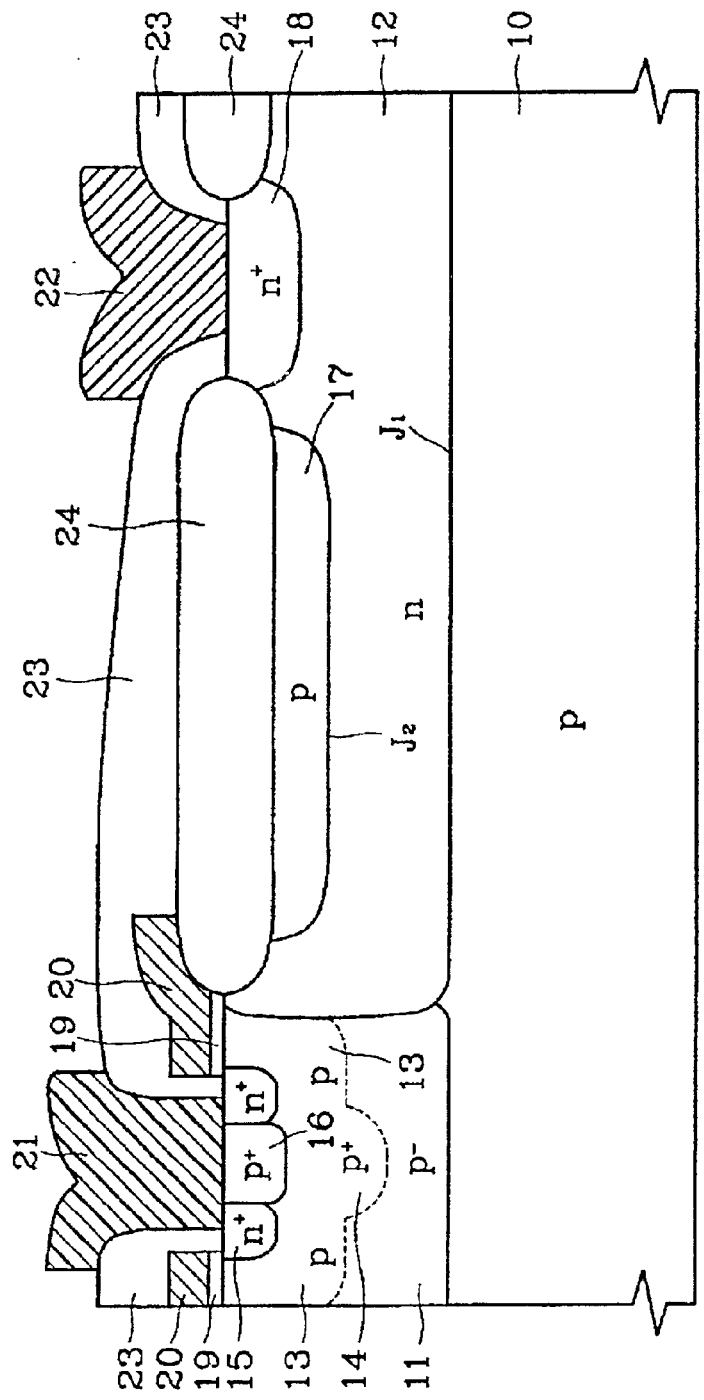
FIG. 2 is a cross-section of the high voltage lateral DMOS transistor of FIG. 1, taken along the line 11–11'.

Hereinafter, an embodiment of the present invention will be described in detail with reference to the attached drawings. The present invention is not restricted to the following embodiment, and many variations are possible within the sprit and scope of the present invention. The embodiment of the present invention is provided in order to more completely explain the present invention to anyone skilled in the art. For example, n-type regions may be p-type regions, and vice versa. In the drawings, the thicknesses of layers or regions are exaggerated for clarity and the same reference numerals denote the same members.

Figure 3:
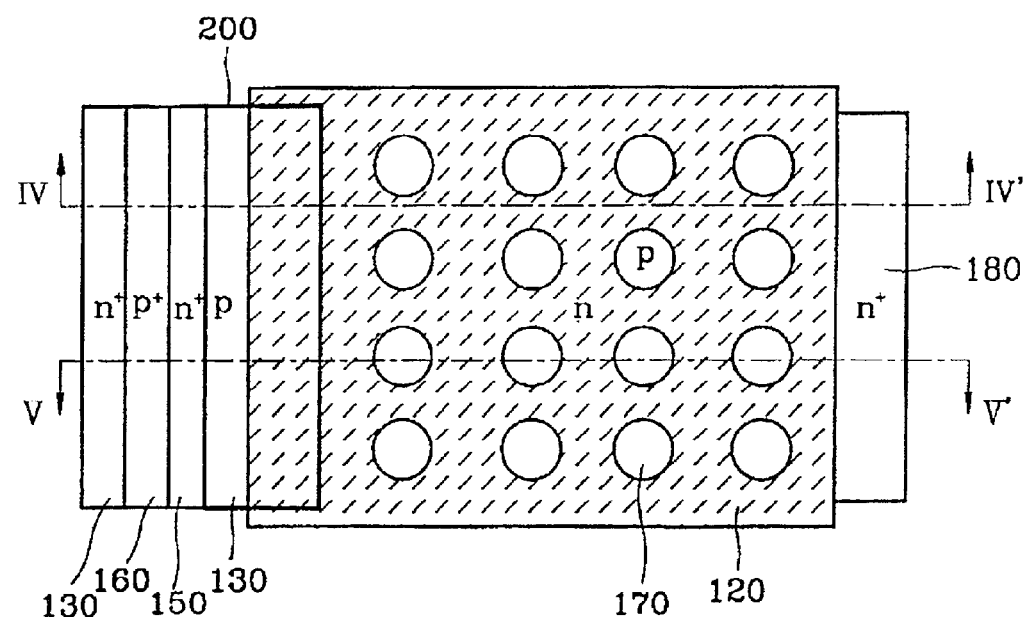
FIG. 3 is a layout diagram of a high voltage lateral DMOS transistor according to the present invention.
Figure 4:
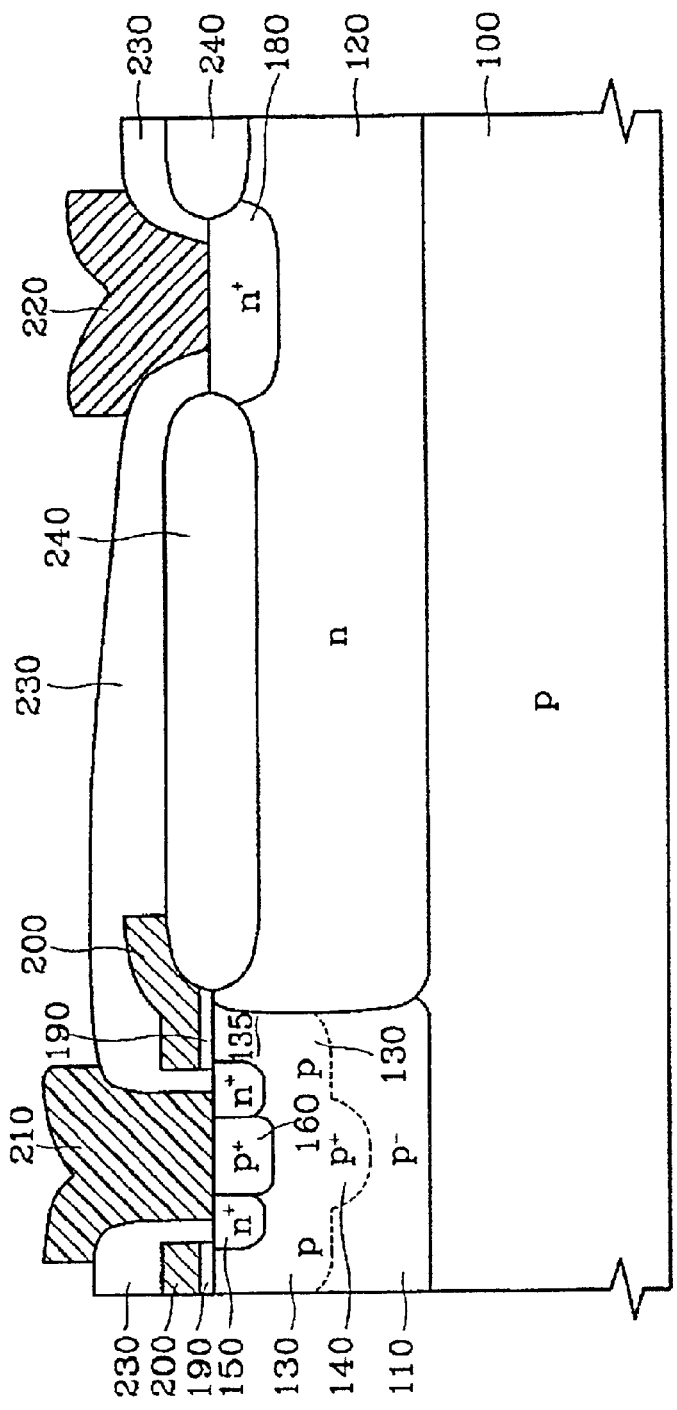
FIG. 4 is a cross-section of the high voltage lateral DMOS transistor of FIG. 3, taken along the line IV-W'.
Figure 5:
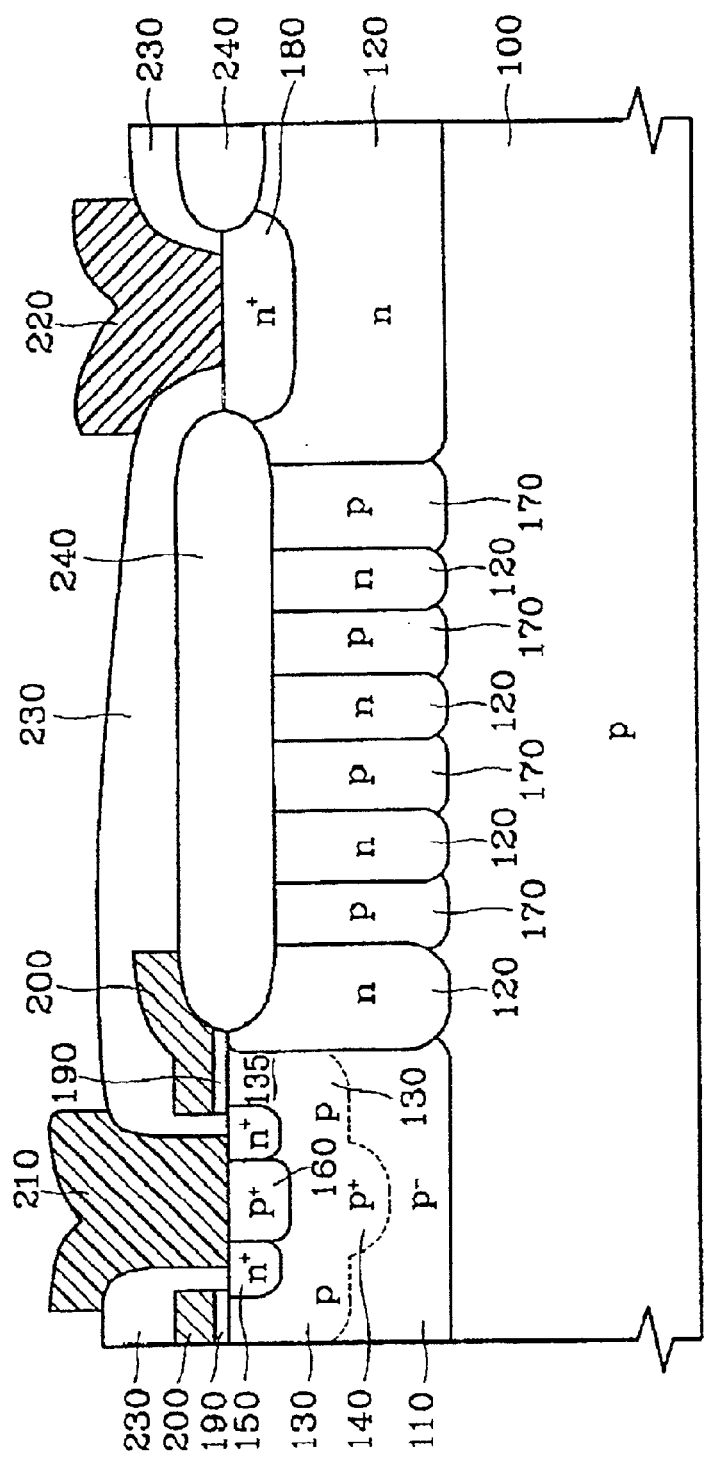
FIG. 5 is a cross-section of the high voltage lateral DMOS transistor of FIG. 3, taken along the line V–V'.

Referring to FIGS. 3 through 5, a p⁻well region 110 and an n⁻ well region 120 are formed in the upper portion of a p-type semiconductor substrate 100. The p-well region 110 may be omitted. The n⁻ well region 120 is used as a drift region. A p-body region 130 having a channel region 135 on its surface and a deep p⁺ body region 140 surrounded by the p-body region 130 are formed in the upper portion of the p⁻ well region 110. An n⁺ source region 150 and a p⁺ contact region 160 surrounded by the n⁺ source region 150 are formed in the upper portion of the pbody region 130 including its surface. The channel region 135 is formed in the upper portion of the p-body region 130, that is, between the n⁺ source region 150 and the n-well region 120.

A plurality of p-well regions 170 and an n⁺ drain region 180 are formed within the n-well region 120. The p-well regions 170 are horizontally spaced out between the channel region 135 within the p-body region 130 and the n⁺ drain region 180. As seen from a plan view shown in FIG. 3 and a cross-section shown in FIG. 5, each p-well region 170 is shaped like a column. The top surfaces of the p-well regions 170 and the top surface of the n-well region 120 are on the same horizontal plane, and the bottom surfaces of the p-well regions 170 and the bottom surface of the n-well region 120 are on the same horizontal plane. The top and bottom surfaces of each p-well region 170 have a circular shape. It is apparent that each p-well region 170 may be formed to have polygon-shaped top and bottom surfaces. However, the circular shape is most preferable in order to suppress concentration of an electric field on each corner.

A gate insulation layer 190 and a gate electrode 200 are sequentially formed on the channel region 135 in the p-body region 130. The n⁺ source region 150 and the p⁺ contact region 160 are electrically connected to a source electrode 210. The n⁺ drain region 180 is electrically connected to a drain electrode 220. The gate electrode 200, the source electrode 210 and the drain electrode 220 are insulated from one another by an interlayer insulation layer 230. Reference numeral 240 denotes an isolation layer formed by LOCal Oxidation of Silicon (LOCOS).

Only the n-well region 120 appears in some portions of the n-well region 120, i.e., the drift region of the high voltage lateral Double diffused Metal Oxide Semiconductor (DMOS) transistor, between the channel region 135 and the n⁺ drain region 180, as shown in FIG. 4, while the n-well region 120 and the p-well regions 170 alternately appear in other portions thereof, as shown in FIG. 5. Current carrying performance within the drift region, i.e., the n-well region 120, is not reduced due to this structure although a double REduced SURface Field (RESURF) structure is applied. In other words, only the n-well region 120 exists in some portions between the channel region 135 and the n⁺ drain region 180, and most current is carried through these portions. Accordingly, a problem of reduction of current carrying performance within a drift region due to existence of the p-well regions 170 does not occur. In addition, high breakdown voltage and low on resistance can be accomplished by using the principle of the double RESURF structure. In other words, when a bias voltage is applied to the n⁺ drain region 180, a depletion region is horizontally formed around the junction between each p-well region 170 and the n-well region 120. Simultaneously, a depletion region is vertically formed around the junction between the semiconductor substrate 100 and the n-well region 120. Accordingly, the n-well region 120 can be completely depleted. Therefore, a surface electric field is uniformly formed between the n~ source region 150 and the n⁺ drain region 180 so that the breakdown voltage of the device increases. In addition, since the n-well region 120 is depleted both horizontally and vertically, the breakdown characteristic of the device is not degraded even if the impurity concentration of the n-well region 120 is sufficiently increased to obtain desirable on-resistance. Accordingly, the operational characteristic of the device can be improved by decreasing the on-resistance by increasing the impurity concentration.

Stated another way, the invention provides a plurality of depletion wells 170 disposed in the drift region 120. The depletion wells 170 are doped with the first conductivity type (p⁻ type) for depleting the drift region 120 in transverse directions. The depletion wells extend from the insulated layer 240 toward the opposite surface of the semiconductor substrate and terminate on the lower boundary of the drift region 120. The wells 170 have a column-like shape, including a circular cross section to define cylindrical columns. The opposite ends of the columns terminate on the opposite boundaries of the drift region.

As described above, according to the present invention, a plurality of p-well regions are formed to be spaced out within the n-well region between a channel region and a drain region so that the breakdown voltage of a device can be increased and the on-resistance of the device can be decreased. In addition, current carrying performance within the n-well region can be improved.

What is claimed is:

1. A high voltage lateral Double diffused Metal Oxide Semiconductor (DMOS) transistor comprising:

a semiconductor substrate of a first conductivity type;

a body region of the first conductivity type formed in a surface of the substrate;

source region of a second conductivity type formed within the body region;

a channel region in the body region between the source and the edge of the body region;

a gate electrode over the channel region and electrically isolated from the substrate by a dielectric material;

a drift region of the second conductivity type formed in a second area of the semiconductor substrate adjacent to the channel region;

a drain region of the second conductivity type formed within the drift region; and well regions of the first conductivity type formed to be horizontally spaced out within the drift region and separated thereby from at least one of the drain and channel regions.

2. The high voltage lateral DMOS transistor of claim 1, wherein each of the well regions of the first conductivity type has the shape of a column, the top surfaces of the well regions and the top surface of the drift region are on the same plane, and the bottom surfaces of the well regions and the bottom surface of the drift region are on the same plane.

3. The high voltage lateral DMOS transistor of claim 2, wherein each of the top and bottom surfaces of each well region of the first conductivity type having the shape of a column has a circular shape.

4. The high voltage lateral DMOS transistor of claim 1, further comprising:
   a source electrode electrically connected to the source region; and
   a drain electrode electrically connected to the drain region.

5. The high voltage lateral DMOS transistor of claim 1, wherein the first conductivity type is a p-type, and the second conductivity type is an n-type.

6. The high voltage lateral DMOS transistor of claim 1, wherein the first conductivity type is an n-type, and the second conductivity type is a p-type.

7. A high voltage lateral Double diffused Metal Oxide Semiconductor (DMOS) transistor comprising:
   a semiconductor substrate of a first conductivity type;
   a drain region in one surface of the substrate and heavily doped with the second, opposite conductivity type;
   a body region in the surface of the substrate and doped with a first conductivity type;
   a source region circumscribed by the body region and heavily doped with a second conductivity type;
   a drift region of the second conductivity type disposed between the body and the drain region;
   an insulated gate disposed over the substrate and over the portion of the body between the source and the drift region;
   an insulating layer on the surface of the substrate and over the drift region;
   a plurality of depletion wells disposed in the drift region and separated thereby from at least one of the drain and channel regions, said depletions wells being doped with the first conductivity type for depleting the drift region in transverse directions.

8. The high voltage DMOS transistor of claim 7 wherein the depletion wells extend from the insulated layer toward the opposite surface of the semiconductor substrate.

9. The high voltage DMOS transistor of claim 7 wherein the depletion wells extend to the lower boundary of the drift region.

10. The high voltage DMOS transistor of claim 7 wherein the depletion wells have depths greater than their widths.

11. The high voltage DMOS of claim 7 wherein the depletion wells have a circular cross section.

12. The high voltage DMOS transistor of claim 7 wherein the depletion wells have a cylindrical shape with circular ends terminating at opposite ends of the drift region.

13. A high voltage lateral Double diffused Metal Oxide Semiconductor (DMOS) transistor comprising:
   a semiconductor substrate of a first conductivity type;
   a body region of the first conductivity type formed in a surface of the substrate;
   source region of a second conductivity type formed within the body region;
   a channel region in the body region between the source and the edge of the body region;
   a gate electrode over the channel region and electrically isolated from the substrate by a dielectric material;
   a drift region of the second conductivity type formed in a second area of the semiconductor substrate adjacent to the channel region;
   a drain region of the second conductivity type formed within the drift region; and
   well regions of the first conductivity type formed to be horizontally spaced out within the drift region and each well region surrounded on all sides by the drift region and separated from the other wells by the drift region.

* * * * *